(12) United States Patent
Bouve et al.

(10) Patent No.: US 10,133,322 B1
(45) Date of Patent: Nov. 20, 2018

(54) GAMING COMPUTER WITH STRUCTURAL COOLING ARRANGEMENT

(71) Applicant: CALYOS SA, Jumet (BE)

(72) Inventors: Quentin Bouve, Sante-Marie-Cappel (FR); Clément Derelle, Ixelles (BE); Nicolas Depret, Fleurus (BE)

(73) Assignee: CALYOS SA, Jumet (BE)

( * ) Notice: Subject to any disclaimer, the term of this patent is extended or adjusted under 35 U.S.C. 154(b) by 0 days.

(21) Appl. No.: 15/711,593

(22) Filed: Sep. 21, 2017

(51) Int. Cl.
*H01L 23/427* (2006.01)
*G06F 1/20* (2006.01)
*H01L 23/467* (2006.01)

(52) U.S. Cl.
CPC .............. *G06F 1/20* (2013.01); *H01L 23/427* (2013.01); *H01L 23/467* (2013.01)

(58) Field of Classification Search
CPC ............ G06F 1/20–1/206; G06F 1/181; G06F 2200/1638; G06F 2200/201; H01L 23/427; H01L 23/467; H05K 7/20154; H05K 7/2039; H05K 7/20163
USPC ...... 361/679.01, 679.02, 679.6, 679.53, 796, 361/679.46–679.54, 688–723; 454/184; 312/236
See application file for complete search history.

(56) References Cited

U.S. PATENT DOCUMENTS

| | | | | |
|---|---|---|---|---|
| 8,416,567 B2 * | 4/2013 | Cheng | ....................... | G06F 1/20 361/679.02 |
| 2006/0056155 A1 * | 3/2006 | Lee | ........................... | G06F 1/20 361/700 |
| 2006/0120036 A1 * | 6/2006 | Rockenfeller | ..... | H05K 7/20836 361/688 |
| 2007/0235167 A1 * | 10/2007 | Brewer | ..................... | G06F 1/20 165/104.33 |
| 2009/0213537 A1 * | 8/2009 | Heesen | ................... | G06F 1/181 361/679.47 |
| 2011/0110029 A1 * | 5/2011 | Lodhia | ..................... | G06F 1/20 361/679.47 |

(Continued)

OTHER PUBLICATIONS

Calyos, "NSG S0: World's First Fanless Chassis for High Performing PC," accessed from https://www.kickstarter.com/projects/1489140137/NSG-S0-Worlds-First-Fanless-Chassis-for-High-Performing PC, published Mar. 29, 2017.

*Primary Examiner* — Jerry Wu
*Assistant Examiner* — Stephen Sul
(74) *Attorney, Agent, or Firm* — Seed IP Law Group LLP (57) ABSTRACT

A computer assembly, having a generally parallelepiped shape with regard to a set of three orthogonal axis XYZ, includes a mother board and an auxiliary board, a first cooling loop with a first heat-intake exchanger in contact with at least one processing unit of the mother board, and a first heat-discharge exchanger, and fluid connections, a second cooling loop with a second heat-intake exchanger in contact with at least one processing unit of the auxiliary board, and a second heat-discharge exchanger, and fluid connections. The first heat-discharge exchanger comprises a first strength member extending at least along a plane XZ and a plurality of first air-cooled fins. The second heat-discharge exchanger comprises a second strength member extending at least along a plane YZ a plurality of second air-cooled fins. The first strength member is fixed to the second strength member to form thereby the structural chassis of the computer assembly.

18 Claims, 6 Drawing Sheets

(56) References Cited

U.S. PATENT DOCUMENTS

| | | | |
|---|---|---|---|
| 2011/0167856 A1* | 7/2011 | Seo | G06F 1/20 |
| | | | 62/259.2 |
| 2012/0314364 A1* | 12/2012 | Tang | G06F 1/20 |
| | | | 361/679.54 |
| 2013/0303264 A1* | 11/2013 | Gill | G07F 17/3216 |
| | | | 463/25 |
| 2014/0211410 A1* | 7/2014 | Cary | G06F 1/20 |
| | | | 361/679.46 |
| 2016/0131438 A1 | 5/2016 | De Troz | |
| 2017/0234623 A1* | 8/2017 | Fried | F28D 15/0266 |
| | | | 165/104.26 |

* cited by examiner

GAMING COMPUTER WITH STRUCTURAL COOLING ARRANGEMENT

BACKGROUND

Technical Field

The present disclosure concerns a computer with powerful graphics processing means, known as "gaming computer". The present disclosure relates to a home computer otherwise a personal computer also known in short as "PC". The term "gaming" comes from the high requirements in terms of graphic processing means for the PC oriented toward gaming applications, running either local gaming application or online gaming applications. Three-dimensional image processing is used to display as much as possible realistic video images involved in the game images.

Although the present disclosure is well suited for such gaming computers, it is also intended to address various configurations where two main boards are to be cooled, in any type of computer, like office computer, server, CAD working station, without limitation to a particular type of computing unit.

Description of the Related Art

In this kind of gaming computers, both the motherboard and the graphic card include powerful heat dissipating processing units, which require to be efficiently cooled. The processing units of the motherboard and the graphic card can each dissipate more than 100 W, often in the range 100 W-300 W, even up to 500 W at full load.

Recently, water cooling circuits have been used to provide an efficient solution to cool the heat dissipating components. However, such water cooling circuits require a pump which circulates the water, and often also require fans to cool the heat discharging section.

Therefore, this kind of solution is noisy and is subject to maintenance requirements.

Therefore, there remains a need to provide enhanced solutions which require no pump, which are maintenance free and where the noise level is decreased.

BRIEF SUMMARY

According to one aspect of the present disclosure, there is disclosed a computer assembly, having a generally parallelepiped shape with regard to a set of three orthogonal axis XYZ, wherein Z denotes a vertical axis, X denotes a longitudinal axis and Y denotes a transversal axis, the computer assembly comprising:
- a mother board (1) and an auxiliary board (2),
- a first cooling loop (91) with a first heat-intake exchanger (31) in contact with at least one processing unit of the mother board, and a first heat-discharge exchanger (41), and first fluid connections (81, 83)
- a second cooling loop (92) with a second heat-intake exchanger (32) in contact with at least one processing unit of the auxiliary board, and a second heat-discharge exchanger, and second fluid connections (82 84),
wherein the first heat-discharge exchanger comprises a first strength member 5 extending at least along a plane XZ and a plurality of first air-cooled fins,
wherein the second heat-discharge exchanger comprises a second strength member 6 extending at least along a plane YZ a plurality of second air-cooled fins,
and wherein the first strength member is fixed to the second strength member to form thereby the structural chassis of the computer assembly.

Thanks to these dispositions, there is no need to provide a conventional chassis for the computer assembly; the chassis structure is made mainly from heat-discharge exchangers.

No additional part is required to form the structural chassis of the computer assembly which contributes to cost reduction.

In various embodiments of the disclosure, one may possibly have recourse in addition to one and/or other of the following arrangements, taken alone or in combination.

According to one option, the cooling loops are two-phase loops, wherein the first heat-intake exchanger is a first evaporator and the second heat-intake exchanger is a second evaporator, wherein the first heat-discharge exchanger is a first condenser and the second heat-discharge exchanger is a second condenser.

This kind of two phase system proves to be particularly efficient with regard to heat transportation; a very low temperature difference is advantageously maintained between the evaporator (pressed against the processing unit to be cooled) and the condenser module.

According to one option, the computer assembly is formed as two modules (M1,M2) assembled together, the first module (M1) comprising the first cooling loop and the mother board, and the second module (M2) comprising the second cooling loop and the auxiliary board.

Therefore, there is provided a very efficient way to prepare and assemble the concerned computer.

According to one option, the auxiliary board is a graphics board.

This particular configuration of the gaming computer or gaming PC is very popular and requires efficient heat evacuation. Furthermore, users of such gaming PC appreciate the quietness of this proposed noiseless solution.

According to one option, the first fins (71) extend along a plane YZ.

This advantageously provides good natural connection. Bottom-up convection is favoured. Across the condenser, air flow easily enters the space between fins.

According to one option, the second fins (72) extend along a plane XZ

This advantageously provides good natural connection. Bottom-up convection is favoured. Here also, across the second condenser, air flow easily enters the space between fins.

According to one option, the first strength member is formed as a structural plate with a central portion (50) and two side portions (51, 52). This shape provides mechanical protection for fins and tubes housed therein, and this shape prevents damages that can be done by an external object that can fall on the computer, and also prevents tampering to some extent. It also protects the user's hand from touching the side of fins that can be too hot to be touched by human skin.

This kind of U shape plate is easy to manufacture. Cutting and folding process is well mastered.

According to one option, the second strength member is formed as a structural plate with a central portion (60) and two side portions (61, 62); preferably, the sides portions extend from each end of the central portion in a perpendicular fashion;

This kind of U shape plate is easy to manufacture. Cutting and folding process is well mastered.

According to one option, the central portion (60) of the second strength member is affixed to one side portion of the first strength member.

This turns out to be a very simple solution for the assembly of the chassis of the computer.

According to one option, the second heat-discharge exchanger lies along the whole width (E) of the computer assembly along Y.

It provides a very large surface for convection. This provides efficient cooling of the auxiliary board/graphics board.

According to one option, there may be provided blowing fans under the fins (71,72).

This advantageously improves convection and lowers temperatures or allow to operate the system in hot environmental conditions.

According to one option, there may be provided drawers to house various items. Thereby, hard disk drives, or various other items can be housed in such drawers.

According to one option, the computer assembly may further comprise a protection plate (13) arranged in such a way that the mother and auxiliary board are interposed between the protection plate (13) and the central portion (50) of the first strength member.

This provides protection from mechanical interference and from damages that may be done by objects. This also prevents infants from tampering into the computer.

According to one option, the protection plate is transparent and made off tempered glass. This provides a robust and nice good-looking solution.

According to one option, the protection plate (13) is fixed to posts (14) anchored on the first and second strength members.

This provides a simple mechanical assembly, easy to assemble and disassemble. There is thereby provided easy access for maintenance and service by simply removing the protection plate.

According to one option, one side portion (51) of the first strength member (5) forms the back end wall of the computer assembly.

There is no need to have an additional part at this place.

According to one option, there is provided a U-shaped pressing bracket (18) to pressurize the first heat-intake exchanger onto the processing unit of the mother board, and/or a U-shaped pressing bracket (18) to pressurize the second heat-intake exchanger (32) onto the processing unit of the auxiliary board.

This allows free passage for sideways-arranged fluid in/out piping.

According to one option, the first heat-discharge exchanger (41) and the second heat-discharge exchanger (42) are provided with spacer rods/tubes (17).

This prevents mechanical damage on the finned portion. This can also maintain proper spacing between fins to guaranty efficient air cooling.

According to one option, view from top, the first and second fins (71,72) occupy more than 75% of the footprint of the computer assembly.

The ability to evacuate heat is unprecedented for a home computer.

According to one option, the volume occupied by the first and second fins (71,72) is more than 75% of the overall volume of the computer assembly (E x H x L).

The ability to evacuate heat is unprecedented for a home computer.

BRIEF DESCRIPTION OF THE SEVERAL VIEWS OF THE DRAWINGS

Other features and advantages of the disclosure appear from the following detailed description of one of its embodiments, given by way of non-limiting example, and with reference to the accompanying drawings, in which.

DETAILED DESCRIPTION

In the figures, the same references denote identical or similar elements.

Figure 1:
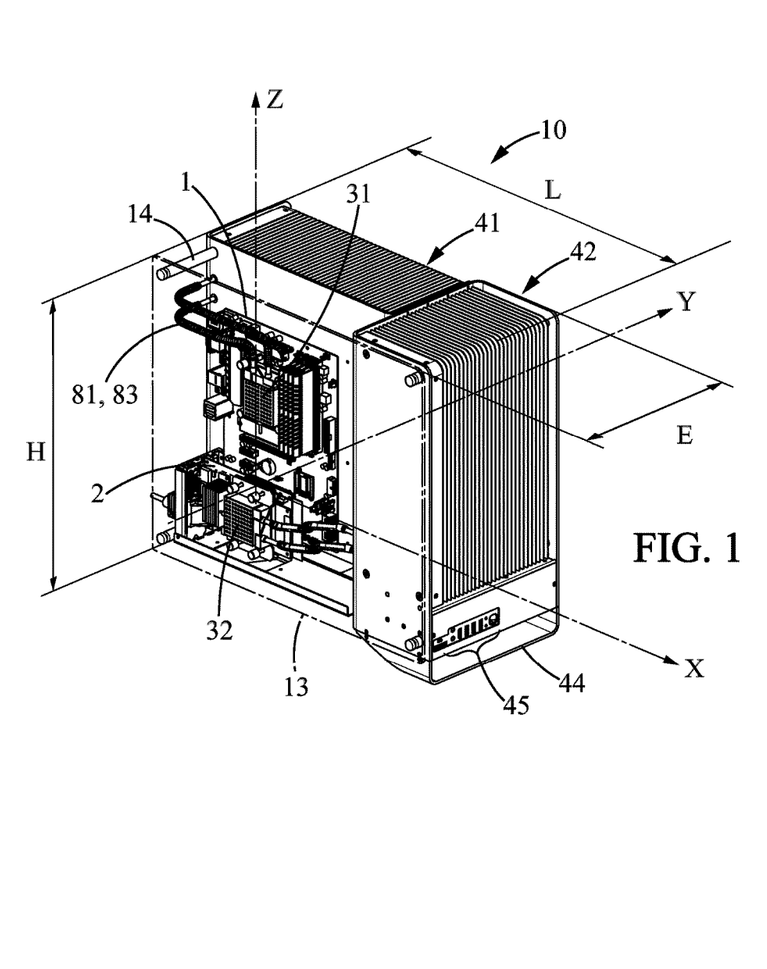
FIG. 1 shows a perspective view of the computer assembly according to the present disclosure.
Figure 2:
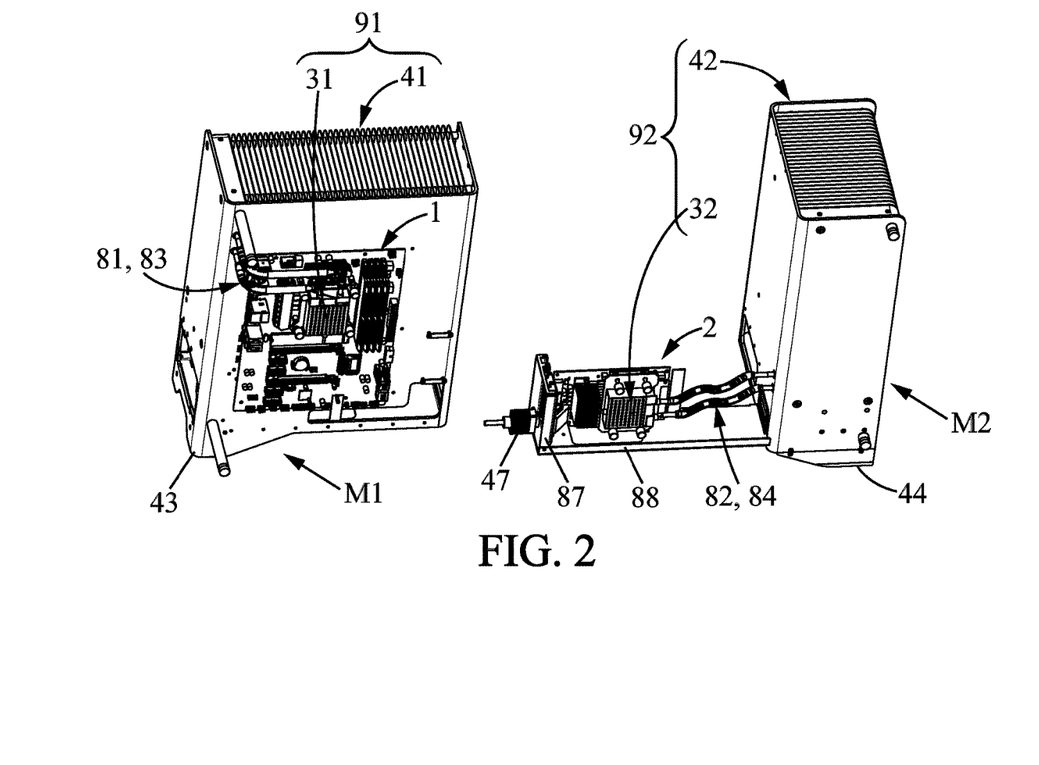
FIG. 2 shows a perspective view of the computer assembly, formed as two modules before assembly.
Figure 3:
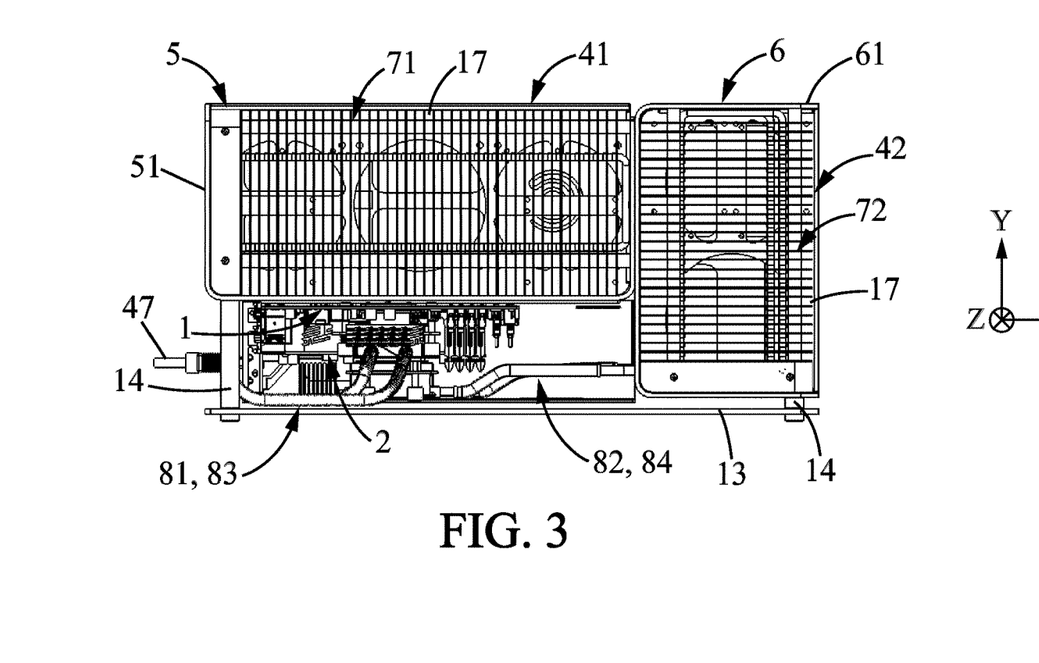
FIG. 3 shows a top view of the computer assembly of FIG. 1.
Figure 4:
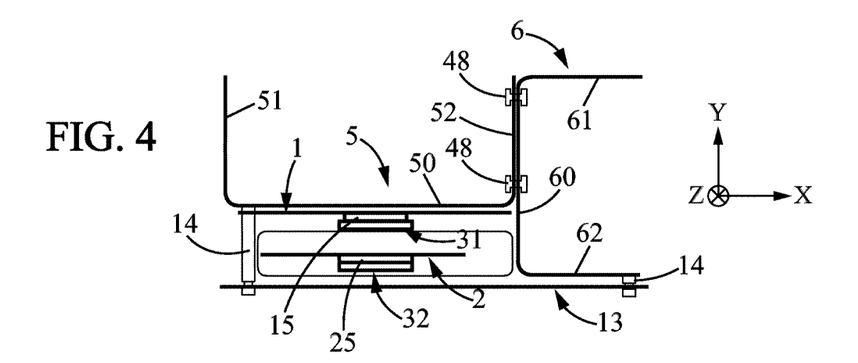
FIG. 4 shows another top, simplified, view of the computer assembly of FIG. 1, FIGS. 5 and 5B show an enlarged view of the processing unit evaporator and pressing bracket, respectively before and after assembly.

As illustrated on FIGS. 1 and 2, one exemplary embodiment of the present disclosure relates to a computer assembly 10.

The computer assembly 10 illustrated here is a gaming PC.

However, any type of computer having two main boards is considered in the scope of the present disclosure, namely any computer that comprises a motherboard and an auxiliary more having a high heat rejection processor.

In use configuration, the computer lies on the ground or on a table, or any surface which is substantially flat.

Regarding directions, there are provided three orthogonal axis XYZ which define a spatial reference. Z denotes a vertical axis, X denotes a longitudinal axis and Y denotes a transversal axis. The surface where lies the computer assembly is therefore substantially parallel to plane XY.

Regarding the electronic resources, the computer assembly comprises preferably standard units, namely those known as COTS "component off the shelf". Among them, a mother board, denoted 1, extends in the illustrated example, parallel to plane XZ. The mother board 1 is, as known per se, a part known as 'PCB'. The mother board 1 includes at least one processing unit 15, which is the 'heart' of the mother board and rejects a large quantity of heat. The mother board 1 generally also includes many other components like memories, couplers, communication interfaces, electrical protections, . . . .

The computer assembly also includes auxiliary board 2, which is, in the illustrated example a graphics board. However, it should be noted that any other type of auxiliary board 2 can be considered, like a calculation coprocessor board, a high performance DSP board, . . . .

The auxiliary board 2 comprises at least one processing unit 25, which produces a large quantity of heat. Examples of powerful processing unit 25 are designed and sold by firms like ™Intel and ™AMD.

There are also provided, as known per se, a power supply unit and wires bundles to establish the appropriate connections between the power supply unit, the mother board, the auxiliary board. There are also provided USB ports, connectors to connect the auxiliary board to one or more display(s).

The front lower face comprises an On/Off switch and USB external ports, collectively denoted 45. There may be provided a foot 44.

The computer assembly is particularly relevant regarding the cooling function, which is now described.

There is provided a first cooling loop 91 with a first heat-intake exchanger 31 in contact with the one or more processing unit(s) 15 of the mother board, and a first heat-discharge exchanger 41.

There is provided a second cooling loop 92 with a second heat-intake exchanger 32 in contact with the one or more processing unit(s) 25 of the auxiliary board, and a second heat-discharge exchanger 42.

In the illustrated example, the first and second cooling loops 91, 92 are two-phase loops, namely they use a working fluid changing from vapor to liquid and vice-versa.

More precisely, the first heat-intake exchanger 31 and the second heat-intake exchanger 32 are evaporators. In the illustrated example, the first heat-discharge exchanger 41 and the second heat-discharge exchanger 42 are condensers. As known in the art, the working fluid changes from liquid to vapor in the evaporator taking heat at this place, and, conversely the working fluid changes from vapor to liquid in the condenser discharging heat at this place.

However, it is not excluded in the frame of the present disclosure to have single phase fluid circulation imparted by a pump.

Returning to the two-phase preferred example, there are provided fluid connections.

In the illustrated example, the first cooling loop 91 comprises first fluid connections: a liquid line 81 and a vapor line 83. The second cooling loops 92 comprises second fluid connections: a liquid line 82 and a vapor line 84.

Liquid lines 81,82 convey liquid toward a wick arranged inside the evaporators 31,32. Said evaporators 31,32 can also be called 'heat spreaders'; an example of internal configuration and operation of such a heat spreader can be found in document EP3027994, which corresponds to U.S. Patent Publication No. 2016/0131438.

According to an advantageous configuration, there is no pump in the cooling loops; the working fluid is circulated thanks to the capillary sucking properties of the wicks comprised in the evaporators.

The fluid connections are made of tubes and/or pipes; therefore the fluid connections are otherwise called 'piping' or 'tubing'. Advantageously, such piping is flexible, so that the evaporator can be separated from the processor unit for maintenance purpose. For example, each of the evaporator can be moved away from the corresponding processing unit by at least 3 cm (even up to 10 cm) without disconnecting the piping and fluid connections. Therefore, it is possible to exchange the mother board and/or the auxiliary board without disconnecting the cooling circuit.

The height of the computer is denoted H. The width of the computer is denoted E. The length of the computer is denoted L.

Typical dimension for height H is comprised between 30 cm and 60 cm.

Typical dimension for width E is comprised between 15 cm and 30 cm.

Typical dimension for length L is comprised between 20 cm and 40 cm.

According to one option, the second heat-discharge exchanger 42 lies along the whole width E of the computer assembly along Y.

As illustrated at FIG. 2, the computer assembly is formed as two modules M1, M2 assembled together.

The first module M1 comprises the first cooling loop 91 and the mother board 1. The second module M2 comprises the second cooling loop 92 and the auxiliary board 2.

The first condenser (heat-discharge exchanger) 41 comprises a first strength member 5 extending at least along a plane XZ and a plurality of first air-cooled fins 71.

The second condenser (heat-discharge exchanger) 42 comprises a second strength member 6 extending at least along a plane YZ a plurality of second air-cooled fins 72.

The first strength member 5 is fixed to the second strength member 6 to form the structural chassis of the computer assembly.

The first strength member 5 is formed as a structural plate with a central portion 50 and two side portions 51,52, extending from each end of the central portion 50 perpendicularly to the central portion. More precisely, the first strength member is made from a U-shape plate manufactured by a well known cutting and folding process. The central portion 50 extends along the plane XZ, each of the side portions 51,52 extend along the plane YZ.

In one example, the motherboard 1 is affixed against the back the central portion 50 of the first strength member 5. However other mechanical configurations are also envisioned.

Likewise, the second strength member 6 is formed as a structural plate with a central portion 60 and two side portions 61,62 extending from each end of the central portion 60 perpendicularly to the central portion. More precisely, the second strength member is made from a U-shape plate manufactured by the well known cutting and folding process. The central portion 60 extends along the plane YZ, each of the side portions 61,62 extend along the plane XZ.

The first and second strength member plates 5,6 are preferably made from aluminum alloy. A very simple process of cutting and folding an aluminum alloy blank can be used to manufacture the strength members 5,6.

The thickness of the first and second strength member plate 5,6 is comprised between 1 mm and 6 mm. Preferably, a thickness comprised between 3 and 5 mm can be chosen. 4 mm thickness can be considered a good compromise in terms of weight/mechanical strength/thermal behaviour. In the illustrated example, the central portion 60 of the second strength member is affixed to the side portion 52 of the first strength member 5. Attachment is made for example by rivets 48, bolts or the like. There may be provided holes at the plate cutting process so affixing the strength members together is easy.

In the illustrated example, there is provided an auxiliary chassis 88,87, otherwise called 'GPU bracket' to support the auxiliary board 2. The auxiliary chassis comprises a base plate 88 and a back plate 87. The back plate 87 supports the connector socket configure to receive the graphic display interface 47 (VGA, HDMI or the like . . . ).

The computer assembly further comprises a protection plate 13 arranged, view from the front face, at left side of the computer, opposite the first condenser 41.

The mother and auxiliary boards are interposed between the protection plate 13 and the central portion 50 of the first strength member 5.

The protection plate 13 is fixed to posts 14 anchored on the first and second strength members. The posts 14 are made of aluminum alloy.

The back posts 14 are anchored to the rear portion of the central portion 50 of the first strength member 5. The front posts 14 are shorter are anchored to the end portion of the side portion 62 of the second strength member 6.

The protection plate 13 is preferably made of tempered glass.

In the illustrated example, the first fins 71 extend along a plane YZ. However, in an alternate embodiment, the first fins 71 extend along a plane XZ.

In the illustrated example, the second fins 72 extend along a plane XZ. However, in an alternate embodiment, the second fins 72 extend along a plane YZ.

The fins are made of aluminum alloy or copper alloy.

There are provided with spacer rods 17 to support the fins. The spacer rods 17 are made of stainless steel.

Figure 7:
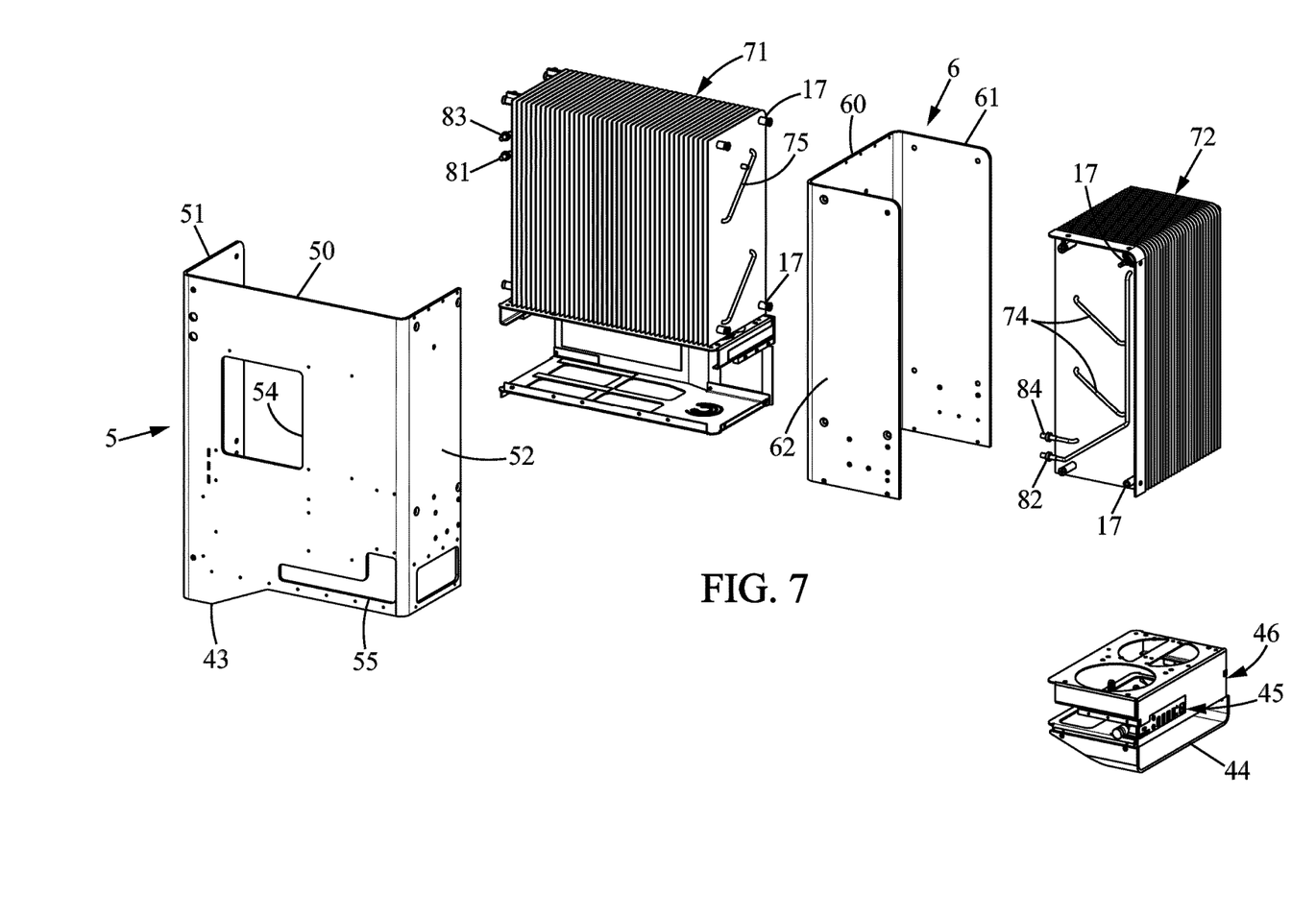
FIG. 7 shows an exploded view of the condensers and of the computer structure.

As apparent from FIG. 7, inside the condenser volume, there are also provided conduits 74,75 in thermal contact with the fins. the working fluid circulates in to said conduits. The conduits are made of copper alloy and preferably with enhanced internal surface.

The configuration of a thermal exchanger like a condenser is known per se, thus not detailed further here.

As seen at FIG. 7, internal conduits 74,75 can comprise several back and forth portions like a serpentine.

In the illustrated example, view from the front face of the computer, the second condenser occupies most of the front face, except the lower portion.

The first condenser occupies the left rear side of the volume. The protection plate 13 forms the left external wall of the computer.

The right backside is formed by the side portion 51 of the first strength member 5.

The position of the mother board is slightly offset to the left with reference to the medial plane of the computer assembly. The position of the graphics board is further the offset to the left, interposed between the mother board evaporator and the protection plate 13.

According to one option, the first and second fins 71,72 occupy more than 75% of the footprint of the computer assembly.

According to one option, the volume occupied by the first and second fins (71,72) is more than 75% of the overall volume of the computer assembly (E x H x L).

Figure 6:
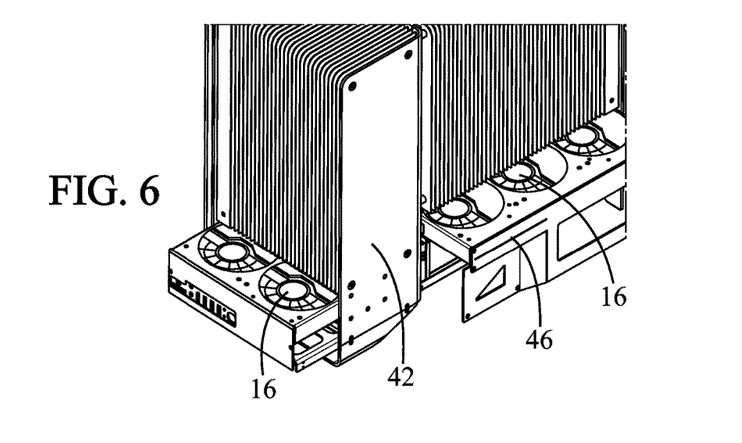
FIG. 6 illustrates one variant with drawers and HDDs.

There are provided drawers 46. Hard disk drives HDD 16 (HDD 3.5 and/or HDD 2.5), extension board, the above-mentioned fans or various other items can be housed in such drawers 46.

In an optional configuration, there may be provided one or more blowing fans. In the shown example the fans are placed under the fins 71,72 in drawers the 46 (at the circular slots shown at FIG. 6). However, the fans can be arranged below the fins in another detachable fashion; the fans can alternately be located atop the fins or in any other location.

A U-shaped pressing bracket 18 is arranged to pressurize the first heat-intake exchanger 31 onto the processing unit(s) of the mother board in order to decrease the thermal contact resistance. Similarly another U-shaped pressing bracket 18 is arranged to pressurize the second heat-intake exchanger 32 onto the processing unit(s) of the auxiliary board.

Pressing bracket 18 with alternate shapes are also considered.

Figure 5:
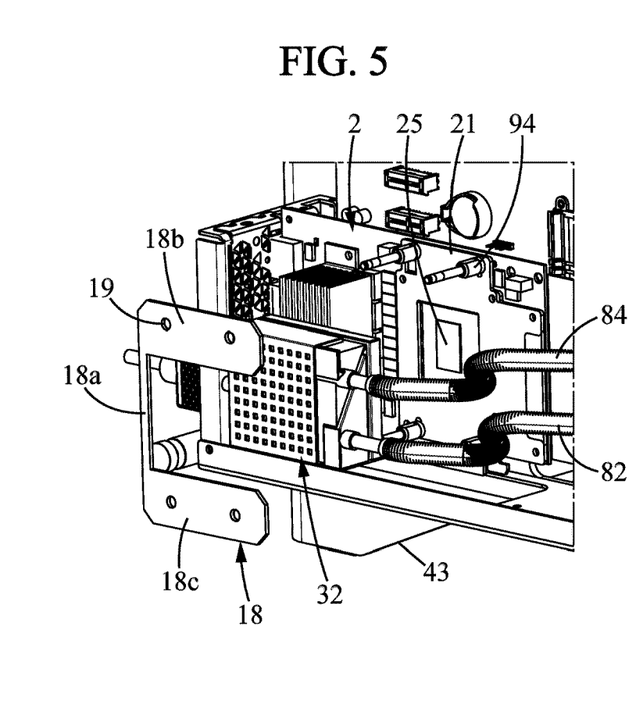
Figure 5B:
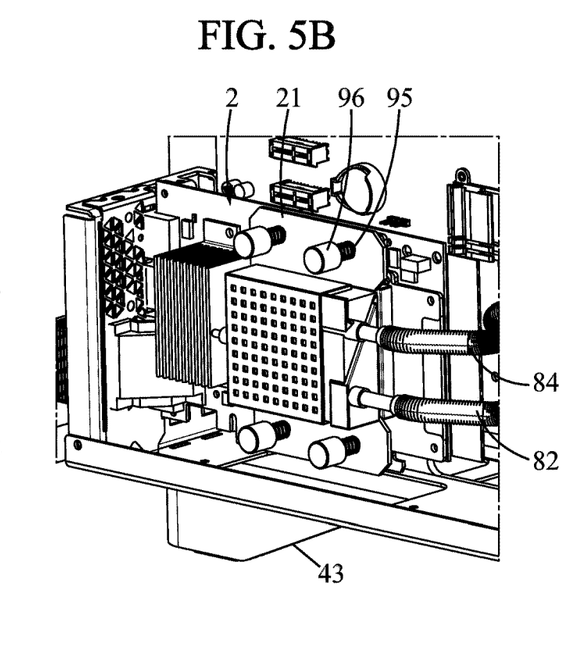

More precisely, turning to FIGS. 5 and 5B, the pressing bracket comprises three branches 18a,18b,18c forming together a U shape part and four holes 19 one at each corner. The holes 19 are disposed in a rectangle corresponding to the position of four studs 94 fixed to the mother board. There are also provided resilient springs 95, interposed between the nuts 96 and pressing bracket 18. The nuts 96 and springs 95 push the pressing bracket such that a permanent hyperstatic pressure is applied by the evaporator 31 to the processing unit 25.

For the graphics board 2, an auxiliary heat spreader plate 21 can be used to favour cooling of various electronic components besides the main processor 25 (GPU Graphic Processing Unit). Thus, components like DIMM (extra in-line memory modules), co-processors, DSPs, auxiliary processors can be in contact with the auxiliary heat spreader plate 21 which is in turn in contact with the evaporator 32.

In the area of the main processing unit 25, the auxiliary heat spreader plate 21 exhibits a large hole such that evaporator 32 can be in direct contact with the main processing unit.

It is not excluded to have such an auxiliary heat spreader plate 21 also for the mother board 1.

There may be provided a front foot 44 and a rear foot 43 to support the computer on the floor.

As seen at FIG. 7, there may be provided large openings 54,55 to provide passage or free space for components. Central openings 54 allows to save weight; overall weight of the computer is less than 30 Kg with is less than equivalent water-cooled solutions for similar gaming power.

Lower opening 55 provides passage for cables from Power Supply Unit and other cables connected to the front panel.

One of the outstanding advantages of the proposed configuration is that the resulting computer is completely noiseless.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A computer assembly, having a generally parallelepiped shape with regard to a set of three orthogonal axis XYZ, wherein Z denotes a vertical axis, X denotes a longitudinal axis and Y denotes a transversal axis, the computer assembly comprising:
    a mother board and an auxiliary board,
    a first cooling loop with a first heat-intake exchanger, a first heat-discharge exchanger, and first fluid connections, the first heat-intake exchanger being in contact with at least one processing unit of the mother board,
    a second cooling loop with a second heat-intake exchanger, a second heat-discharge exchanger, and second fluid connections, the second heat-intake exchanger being in contact with at least one processing unit of the auxiliary board,
    wherein the first heat-discharge exchanger comprises a first strength member, extending at least along a plane XZ, and a plurality of first air-cooled fins,
    wherein the second heat-discharge exchanger comprises a second strength member, extending at least along a plane YZ, and a plurality of second air-cooled fins, and wherein the first strength member is fixed to the second strength member to form thereby a structural chassis of the computer assembly.

2. The computer assembly according to claim 1, wherein the cooling loops are two-phase loops, wherein the first heat-intake exchanger is a first evaporator and the second heat-intake exchanger is a second evaporator, wherein the first heat-discharge exchanger is a first condenser and the second heat-discharge exchanger is a second condenser.

3. The computer assembly according to claim 1, wherein the computer assembly includes two modules assembled together, the first module comprising the first cooling loop and the mother board, and the second module comprising the second cooling loop and the auxiliary board.

4. The computer assembly according to claim 1, wherein the auxiliary board is a graphics board.

5. The computer assembly according to claim 1, wherein the first air-cooled fins extend along a plane YZ.

6. The computer assembly according to claim 1, wherein the second air-cooled fins extend along a plane XZ.

7. The computer assembly according to claim 1, wherein the first strength member is a structural plate with a central portion and two side portions.

8. The computer assembly according to claim 1, wherein the second strength member is a structural plate with a central portion and two side portions.

9. The computer assembly according to claim 8, wherein:
the first strength member is a structural plate with a central portion and two side portions, and
the central portion of the second strength member is affixed to one side portion of the first strength member.

10. The computer assembly according to claim 1, wherein the second heat-discharge exchanger lies along a whole width of the computer assembly along Y.

11. The computer assembly according to claim 1, further comprising fans under the fins.

12. The computer assembly according to claim 1, further comprising a protection plate arranged in such a way that the mother and auxiliary boards are interposed between the protection plate and a central portion of the first strength member.

13. The computer assembly according to claim 12, wherein the protection plate is fixed to posts anchored on the first and second strength members.

14. The computer assembly according to claim 1, wherein:
the first strength member is a structural plate with a central portion and two side portions; and
one side portion of the first strength member forms, at least partly, a back end wall of the computer assembly.

15. The computer assembly according to claim 1, further comprising:
a U-shaped pressing bracket to pressurize the first heat-intake exchanger onto the at least one processing unit of the mother board, and/or a U-shaped pressing bracket to pressurize the second heat-intake exchanger onto the at least one processing unit of the auxiliary board.

16. The computer assembly according to claim 1, wherein the first heat-discharge exchanger and the second heat-discharge exchanger are provided with spacer rods.

17. The computer assembly according to claim 1, wherein, viewed from a top, the first and second air-cooled fins occupy more than 75% of a footprint of the computer assembly.

18. The computer assembly according to claim 1, wherein a volume occupied by the first and air-cooled second fins is more than 75% of an overall volume of the computer assembly.

* * * * *